(12) United States Patent
Zhu et al.

(10) Patent No.: US 10,886,500 B2
(45) Date of Patent: Jan. 5, 2021

(54) DISPLAY PANEL, MANUFACTURING METHOD THEREOF, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Hongli Zhu, Beijing (CN); Haijun Shi, Beijing (CN); Zhanchang Bu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/157,865

(22) Filed: Oct. 11, 2018

(65) Prior Publication Data

US 2019/0123297 A1 Apr. 25, 2019

(30) Foreign Application Priority Data

Oct. 19, 2017 (CN) .......................... 2017 1 0980292

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 51/5259* (2013.01); *H01L 51/56* (2013.01)

(58) Field of Classification Search
CPC .. G02F 1/1333; G02F 1/1339; G02F 1/13392; G02F 1/13394; G02F 2001/13396; G02F 2001/13398; H01L 51/5246; H01L 51/524–525; H01L 27/32; H01L 27/3244; H01L 51/5259; H01L 51/56; H05B 33/04
See application file for complete search history.

(56) References Cited

U.S. PATENT DOCUMENTS 7,724,341 B2 * 5/2010 Kondo ................ G02F 1/1339
349/153
8,907,354 B2 * 12/2014 Ingle ................ H01L 51/0021
257/81

(Continued)

FOREIGN PATENT DOCUMENTS

| CN | 101009307 A | 8/2007 |
|---|---|---|
| CN | 106784379 A | 5/2017 |
| CN | 107104201 A | 8/2017 |

OTHER PUBLICATIONS

First Office Action dated Jul. 31, 2019; Corresponding to Chinese Application No. 201710980292.3; English Translation Attached.

*Primary Examiner* — Eric A. Ward
(74) *Attorney, Agent, or Firm* — Nath, Goldberg & Meyer; Joshua B. Goldberg

(57) ABSTRACT

The present disclosure relates to a display panel, a manufacturing method thereof, and a display device. The display panel comprises a base substrate, a package cover plat disposed to be parallel to the base substrate, a light-emitting layer between the substrate and the package cover plate, and a main package part, which encapsulates a side surface of the base substrate and a side surface of the package cover plate.

4 Claims, 5 Drawing Sheets

(56) References Cited

U.S. PATENT DOCUMENTS

| | | | |
|---|---|---|---|
| 2006/0278965 A1* | 12/2006 | Foust | H01L 51/5243 257/678 |
| 2007/0170839 A1 | 7/2007 | Choi et al. | |
| 2011/0114954 A1* | 5/2011 | Lee | H01L 51/5246 257/59 |
| 2014/0085579 A1* | 3/2014 | Fan | G02F 1/133351 349/123 |
| 2014/0293211 A1* | 10/2014 | Terao | G02F 1/1339 349/153 |
| 2015/0214502 A1* | 7/2015 | Sato | H01L 51/5246 257/88 |
| 2015/0349288 A1* | 12/2015 | Luo | H01L 51/5237 257/99 |
| 2016/0087243 A1* | 3/2016 | Senoo | H01L 51/5246 257/40 |
| 2017/0170247 A1* | 6/2017 | Kim | H01L 27/3213 |
| 2017/0280531 A1* | 9/2017 | Tada | H01L 51/5256 |

* cited by examiner

US 10,886,500 B2

DISPLAY PANEL, MANUFACTURING METHOD THEREOF, AND DISPLAY DEVICE

CROSS-REFERENCE TO RELATED APPLICATION

This application claims the priority of China Patent Application No. 201710980292.3, filed in China on Oct. 19, 2017, the entire contents of which are hereby incorporated by reference.

TECHNICAL FIELD

The present disclosure relates to the field of display technologies, and in particular, to a display panel, a manufacturing method thereof, and a display device.

BACKGROUND

The OLED display device is a display device having self-luminous characteristics, which can be used for flexible display and can display a high-contrast picture in a state of low power consumption. However, an OLED light-emitting device in the OLED display device is easily affected by moisture such that the service life of the OLED display devices is affected.

SUMMARY

The present disclosure provides following technical solution: a display panel, comprising: a base substrate, a package cover plate, which is disposed to be parallel to the base substrate, a light-emitting layer, which is disposed between the substrate and the package cover plate, and a main package part, which encapsulates a side surface of the base substrate and a side surface of the package cover plate.

The present disclosure also provides a manufacturing method of a display panel, comprising: providing a base substrate; forming a light-emitting layer on a surface of the base substrate; providing a package cover plate disposed to be parallel to the base substrate; using a main package part to encapsulate a side surface of the base substrate on which the light-emitting layer is formed and a side surface of the package cover plate together such that the light-emitting layer is located between the base substrate and the package cover plate.

The present disclosure also provides a display device comprising the display panel described above.

BRIEF DESCRIPTION OF THE DRAWINGS

The drawings described herein are intended to provide a further understanding of the present disclosure, and are intended to be a part of the present disclosure. The illustrative embodiments in the present disclosure and the description thereof are illustration for the present disclosure and do not constitute a limitation to the present disclosure. In the drawing.

DETAILED DESCRIPTION OF THE EMBODIMENTS

The technical solutions in the embodiments of the present disclosure are clearly and completely described in the following with reference to the accompanying drawings in the embodiments of the present disclosure. It is obvious that the described embodiments are only a part of the embodiments of the present disclosure, and not all of the embodiments. All other embodiments obtained by a ordinary skilled in the art based on the embodiments of the present disclosure without departing from the inventive scope are within the scope of the disclosure.

Figure 1:
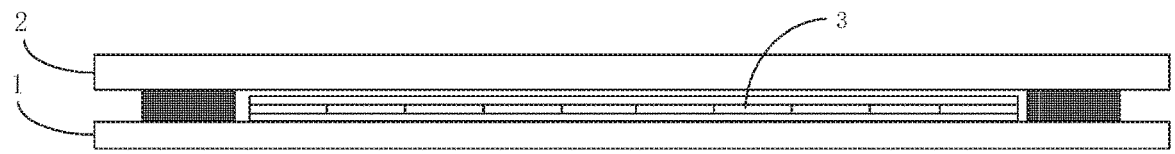
FIG. 1 is a schematic structural view of a display panel in the related art.

At present, a display panel in an OLED display device as shown in FIG. 1 includes a base substrate 1, a package cover plate 2, and a light-emitting layer 3 between the base substrate and the package cover plate 2. The base substrate and the package cover plate 2 are bonded by an encapsulant, so as to seal the light-emitting layer 3 between the base substrate and the package cover plate 2, thereby preventing the light-emitting layer 3 from being affected by moisture. When the base substrate and the package cover plate 2 are bonded together, if foreign matter remains on a board surface of the base substrate 1 and/or a board surface of the package cover plate 2, it is easy to cause the encapsulant cannot be completely fitted to the base substrate 1 and/or the package cover plate 2. Consequently, the moisture easily enters between the base substrate 1 and the package cover plate 2, resulting in a decreased service life of the OLED light-emitting device (component) in the light-emitting layer 3 due to moisture.

The present disclosure provides at least a display panel, a manufacturing method thereof, and a display device, which can reduce the probability of moisture entering between the base substrate and the package cover plate to a certain extent, thereby ensuring the service life of the OLED light-emitting device in the light-emitting layer. Specific embodiments of the present disclosure are described below in conjunction with the drawings.

Figure 2:
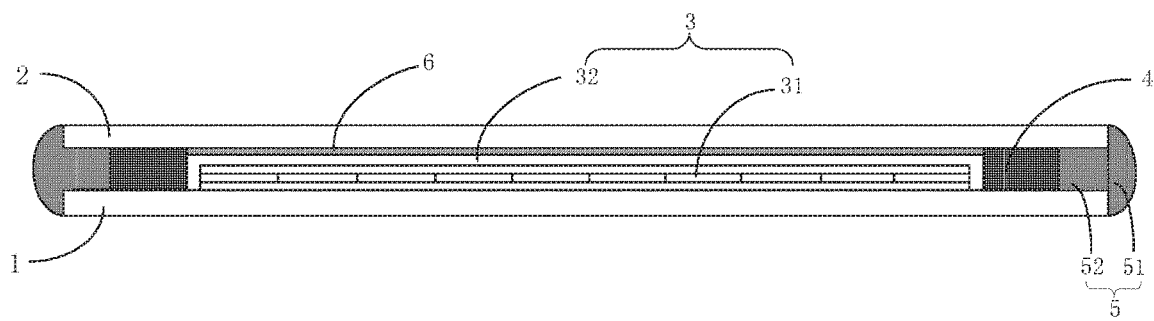
FIG. 2 is a schematic structural view of a display panel according to an embodiment of the present disclosure.

Referring to FIG. 2, a display panel provided by an embodiment of the present disclosure includes: a base substrate 1; a package cover plate 2, which is disposed to be parallel to the base substrate 1; a light-emitting layer 3, which is disposed between the base substrate 1 and the package cover plate 2; and a main package part 5, which encapsulates a side surface of the base substrate 1 and a side surface of the package cover plate 2. Herein, "side surface" refers to the surface on which a circumferential edge of the object is located. For example, as shown in FIG. 2, "the side surface of the base substrate" is an end surface of the base substrate 1 in the left-right direction; and "the side surface of the package cover plate" is an end surface of the package cover plate 2 in the left-right direction. Since the main package part 5 encapsulates the sides of both the base substrate 1 and the package cover plate 2, the probability of moisture entering between the base substrate 1 and the package cover plate 2 is reduced. Thereby, the service life of the OLED display device in the light-emitting layer is prevented from being decreased.

In an embodiment of the present disclosure, the main package part 5 may include a first package portion 51 and a second package portion 52. The second package portion 52 is located between the base substrate 1 and the package cover plate 2. An upper surface of the second package portion 52 is in contact with the package cover plate 2, and a lower surface of the second package portion 52 is in contact with the base substrate 1. The first package portion 51 is respectively engaged with the side surface of the base substrate 1, the side surface of the package cover plate 2, and an outer-side surface of the second package portion 52.

Figure 5:
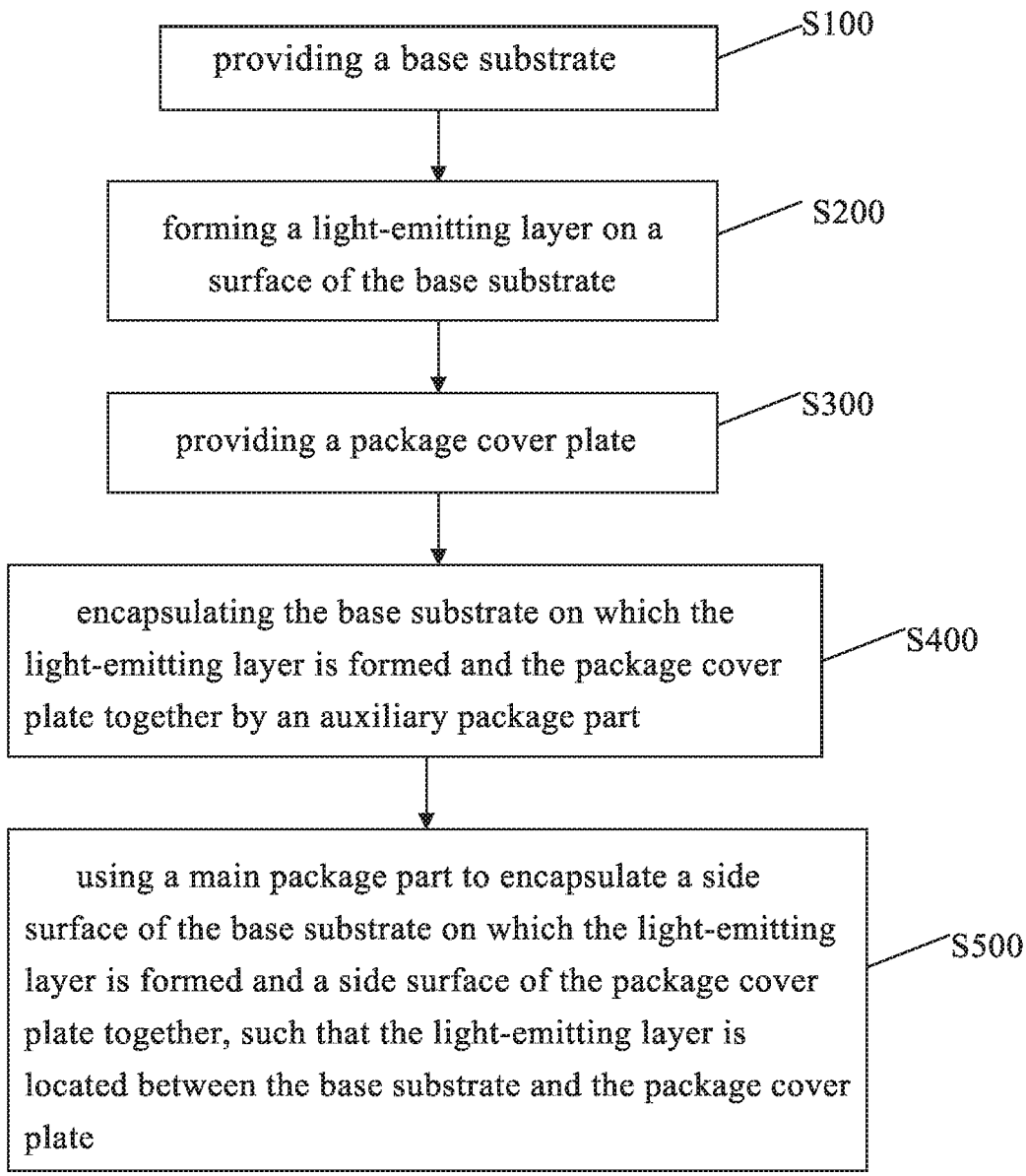
FIG. 5 is a flow chart of manufacturing a display panel according to an embodiment of the present disclosure.

A manufacturing method of a display panel provided by an embodiment of the present disclosure is as shown in FIG. 5, and includes the following steps:

Step S100: providing a base substrate 1;

Step S200: forming a light-emitting layer 3 on a surface of the base substrate 1;

Step S300: providing a package cover plate 2;

Step S500: using a main package part 5 to encapsulate the base substrate 1 on which the light-emitting layer 3 is formed and the package cover plate 2 together, such that the light-emitting layer 3 is located between the base substrate 1 and the package cover plate 2.

The main package part 5 may include a first package portion 51 and a second package portion 52. The first package portion 51 is respectively engaged with the side surface of the base substrate 1, the side surface of the package cover plate 2, and an outer-side surface of the second package portion 52. The second package portion 52 is located between the base substrate 1 and the package cover plate 2. An upper surface of the second package portion 52 is in contact with the package cover plate 2, and a lower surface of the second package portion 52 is in contact with the base substrate 1.

In the display panel provided by the above embodiment, the main package part 5 includes a first package portion 51 and a second package portion 52, and the second package portion 52 is located between the base substrate 1 and the package cover plate 2. The first package portion 51 is respectively engaged with the side surface of the base substrate 1, the side surface of the package cover plate 2, and an outer-side surface of the second package portion 52. Therefore, in the case where foreign matter is on the board surface of the base substrate 1 and/or the board surface of the package cover plate 2 such that the second package portion 52 cannot be completely fitted to the base substrate 1 and/or the package cover plate 2, the side surface of the base substrate 1 and the side surface of the package cover plate 2 are both parallel to the direction of gravity during packaging, so that foreign matter is difficult to adhere to the side surface of the base substrate 1 and the side surface of the package cover plate 2. Thereby, it is ensured that the first package portion 51 can be completely fitted to the side surface of the base substrate 1 and the side surface of the package cover plate 2. In addition, the first package portion 51 is respectively engaged with the side surface of the base substrate 1, the side surface of the package cover plate 2, and an outer-side surface of the second package portion 52. Therefore, the first package portion 51 can also protect the second package portion 52, so as to further reduce the probability of moisture entering between the base substrate 1 and the package cover plate 2, thereby the service life of the OLED display device in the light-emitting layer is prevented from being decreased.

Considering that the packaging material used in the main package part 5 is an encapsulant, the encapsulant needs to be heated during packaging, so that the inside of the encapsulant is prone to holes. Based on this, the width of the first package portion 51 in the above embodiment gradually increases and then gradually decreases from the base substrate 1 towards the package cover plate 2 in a direction perpendicular to the base substrate 1. A portion of the first package portion 51 having a maximum width is corresponding to the outer-side surface of the second package portion 52; and a width direction of the first package portion 51 is parallel to the base substrate 1. It can be understood that the width direction of the first package portion 51 herein is only required to be parallel to the substrate surface of the base substrate 1, and the orientation is not particularly limited. As shown in FIG. 2, the width of the first package portion 51 is defined as the distance between the left side surface and the right side surface of the first package portion in the left-right direction in FIG. 2.

It can be seen from the trend of the width of the first package portion 51 that: the portion of the first package portion 51 having the maximum width is corresponding to the outer-side surface of the second package portion 52. Therefore, it is possible to lengthen a path length of the external moisture contacting the second package portion 52, so as to further improve the moisture resistance of the first package portion 51. Since the width of the first package portion 51 gradually increases and then decreases along a direction from the base substrate 1 to the package cover plate 2 (i.e., from the base substrate 1 to the package cover plate 2 in the direction perpendicular to the base substrate 1), the closer the distance from the outer surface of the first package portion 51 to the second package portion 52, the greater the probability that the external moisture contacts the second package portion 52 through the first package portion 51; the longer the distance from the outer surface of the first package portion 51 to the second package portion 52, the smaller the probability that moisture contacts the second package portion 52 through the first package portion 51. Therefore, the width of the first package portion 51 in the embodiment of the present disclosure gradually increases and then gradually decreases from the base substrate 1 towards the package cover plate 2 in the direction perpendicular to the base substrate 1, so as to reduce the probability of the second package portion 52 contacting the moisture and reduce unnecessary material waste when forming the first package portion 51.

It can be known that the outer-side surface of the second package portion 52 in the above embodiment can be integrated with the first package portion 51, so that the fabrication of the main package part 5 can be completed at one time in the process of manufacturing the display panel.

Figure 3:
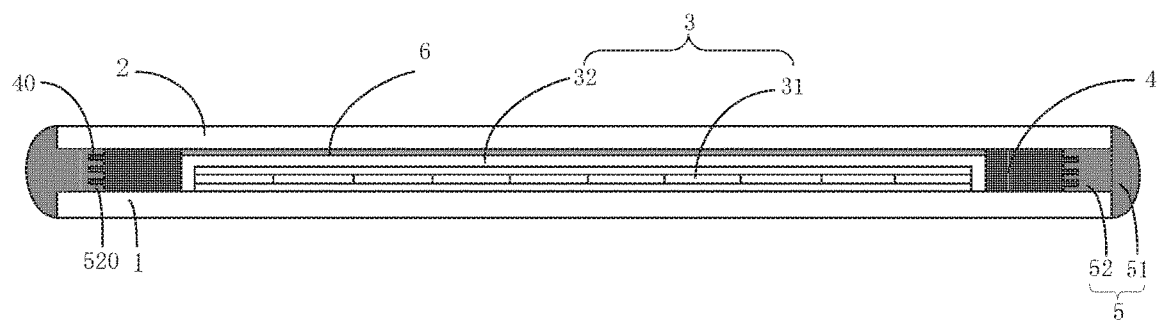
FIG. 3 is a schematic structural view of a display panel according to an embodiment of the present disclosure.
Figure 4:
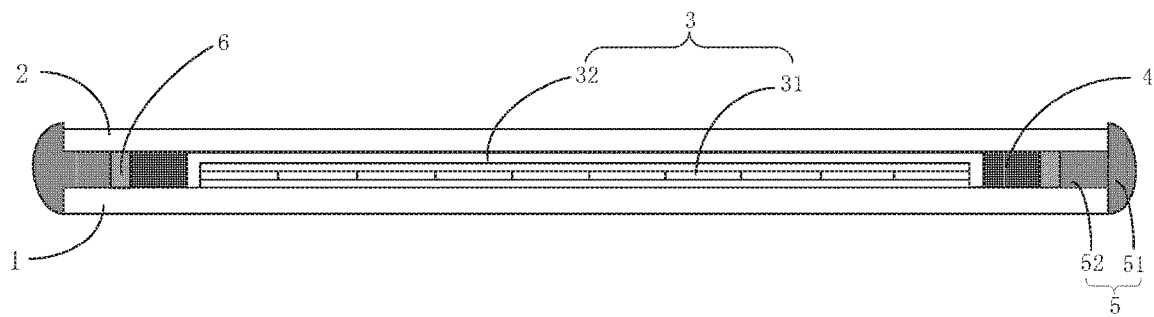
FIG. 4 is a schematic structural view of a display panel according to an embodiment of the present disclosure.

As shown in FIGS. 2-4, the inner-side surface of the second package portion 52 faces with the side surface of the light-emitting layer 3. An auxiliary package part 4 is disposed between the inner-side surface of the second package portion 52 and the light-emitting layer 4. The upper surface of the auxiliary package part 4 is in contact with the package cover plate 2, and the lower surface of the auxiliary package part 4 is in contact with the base substrate 1. An outer-side surface of the auxiliary package part 4 faces with the inner-side surface of the second package portion 52, and an inner-side surface of the auxiliary package part 4 faces with the side surface of the light-emitting layer 3. Thereby, when the main package part 5 does not completely block the moisture, the moisture is further blocked from entering between the base substrate 1 and the package cover plate 2.

There may be a gap between the inner-side surface of the auxiliary package part 4 and the side surface of the light-emitting layer 3, or they may be in contact with each other.

Optionally, the inner-side surface of the auxiliary package part 4 is in contact with the side surface of the light-emitting layer 3 to position the light-emitting layer 3 by using the auxiliary package part 4, so as to prevent the light-emitting layer 3 from being displaced.

Furthermore, as shown in FIG. 3, the outer-side surface of the auxiliary package part 4 in the above embodiment has a plurality of first limiting portions 40. The inner-side surface of the second package portion 52 has a plurality of second limiting portions 520 corresponding to the plurality of the first limiting portions 40, and each of the first limiting portions 40 and each of the second limiting portions 520 corresponding thereto are joined together. In this case, the specific area of the outer-side surface of the auxiliary package part 4 having the plurality of first limiting portions 40 is relatively large, so that the outer-side surface of the auxiliary package part 4 is more closely joined with the inner-side surface of the second package portion 52.

The specific structure of the first limiting portion 40 and the second limiting portion 520 can be set according to actual conditions, for example, the first limiting portion 40 is a convex structure, and the second limiting portion 520 is a concave structure.

In order to completely eliminate the influence of moisture on the OLED light-emitting device in the light-emitting layer 3, a moisture absorbing layer 6 may be added to the display panel provided in the above embodiment so as to absorb the moisture in the display panel. The moisture absorbing layer 6 can be made of a water absorbing material such as a desiccant.

The first structure of the moisture absorbing layer 6: as shown in FIG. 2 and FIG. 3, a moisture absorbing layer 6 is disposed between a surface of the light-emitting layer 3 facing away from the base substrate 1 and the package cover plate 2, and the moisture absorbing layer 6 is transparent, so as to ensure that the moisture absorbing layer 6 does not affect the screen display of the display panel. The material used for the moisture absorbing layer 6 is a light transmitting material such as silica gel.

When the main package part 5 and the auxiliary package part 4 are not completely insulated from moisture, the moisture absorbing layer 6 is capable of absorbing the moisture positioned between the base substrate 1 and the package cover plate 2. If moisture remains between the base substrate 1 and the package cover plate 2 during the packaging process, the moisture absorbing layer 6 can also be used to absorb moisture remaining between the base substrate 1 and the package cover plate 2 during the packaging process, so as to ensure the light-emitting layer between the base substrate 1 and the package cover plate 2 is in a dry condition.

The second structure of the moisture absorbing layer 6: as shown in FIG. 4, the moisture absorbing layer 6 is disposed between the inner-side surface of the second package portion 52 and the outer-side surface of the auxiliary package part 4. Since the second package portion 52 and the auxiliary package part 4 are both located in the frame region of the display panel, this makes the moisture absorbing layer 6 not affect the light transmission of the light-emitting layer 3. In this case, the moisture absorbing layer 6 can be transparent (light-transmitted) or light-shielded, that is, the material used for the moisture absorbing layer 6 can be transparent or light-shielded without special requirements.

It should be noted that, in the first structure of the above embodiment, the moisture absorbing layer 6 is disposed between the surface of the light-emitting layer 3 facing away from the base substrate 1 and the package cover plate 2, so that the thickness of the display panel is increased. In comparison, in the second structure, the moisture absorbing layer 6 is located between the inner-side surface of the second package portion 52 and the outer-side surface of the auxiliary package part 4, so that the thickness of the display panel is not increased. In this case, the moisture that is not blocked by the main package part 5 can be absorbed to prevent moisture from contacting the auxiliary package part 4.

It should be noted that, in the above embodiment, the packaging material of both of the main package part 5 and the auxiliary package part 4 is a thermosetting encapsulant. Alternatively, it can also be a photocurable encapsulant or other packaging material.

In addition, in order to further block the moisture, as shown in FIGS. 2-4, the light-emitting layer in the above embodiment includes an arrayed OLED light-emitting device 31 and a water-oxygen barrier layer 32 encapsulating the arrayed OLED light-emitting device 31. Thereby, the arrayed OLED light-emitting device 31 is further protected from moisture, such that better prolonging the service life of the OLED light-emitting device.

An outer-side surface of the water-oxygen barrier layer may face with an inner-side surface of the second package portion 52, and a surface of the water-oxygen barrier layer facing away from the arrayed OLED light-emitting device 31 faces with the package cover plate 2.

As shown in FIGS. 2-4 and FIG. 5, an embodiment of the present disclosure further provides a manufacturing method of a display panel. The manufacturing method of the display panel includes the following steps:

Step S100: providing a base substrate 1;

Step S200: forming a light-emitting layer 3 on a surface of the base substrate 1;

Step S300: providing a package cover plate 2 disposed to be parallel to the base substrate 1;

Step S500: using a main package part 5 to encapsulate a side surface of the base substrate 1 on which the light-emitting layer 3 is formed and a side surface of the package cover plate 2 together, such that the light-emitting layer 3 is located between the base substrate 1 and the package cover plate 2.

The main package part may include a first package portion 51 and a second package portion 52. The first package portion 51 is respectively engaged with the side surface of the base substrate 1, the side surface of the package cover plate 2, and an outer-side surface of the second package portion 52. The second package portion 52 is located between the base substrate 1 and the package cover plate 2, an upper surface of the second package portion 52 is in contact with the package cover plate 2, and a lower surface of the second package portion 52 is in contact with the base substrate 1.

The beneficial effects of the manufacturing method of the display panel provided by the embodiment of the present disclosure are the same as those provided by the above technical solutions, and are not described herein.

It should be noted that, as shown in FIGS. 2-4 and FIG. 10, in the above embodiment, forming the light-emitting layer 3 on the surface of the base substrate 1 includes the following steps:

Step S201: forming an arrayed OLED light-emitting device on a surface of a display region of the base substrate 1.

Step S202: forming a water-oxygen barrier layer 32 on a side surface of the arrayed OLED light-emitting device and a surface of the arrayed OLED light-emitting device facing away from the base substrate 1, so that the light-emitting layer 3 is obtained.

Particularly, the outer-side surface of the water-oxygen barrier layer faces with the inner-side surface of the second package portion 52, and a surface of the water-oxygen barrier layer facing away from the arrayed OLED light-emitting device 31 faces with the package cover plate 2.

Between the step S300 and the step S500 in the above embodiment, the manufacturing method of the display panel provided by the above embodiment further includes the step S400: encapsulating the base substrate 1 on which the light-emitting layer 3 is formed and the package cover plate 2 together by an auxiliary package part 4, such that an upper surface of the auxiliary package part 4 is in contact with the package cover plate 2, a lower surface of the auxiliary package part 4 is in contact with the base substrate 1, and an outer-side surface of the auxiliary package part 4 faces with an inner-side surface of the second package portion 52, and an inner-side surface of the auxiliary package part 4 faces with a side surface of the light-emitting layer 3.

Figure 6:
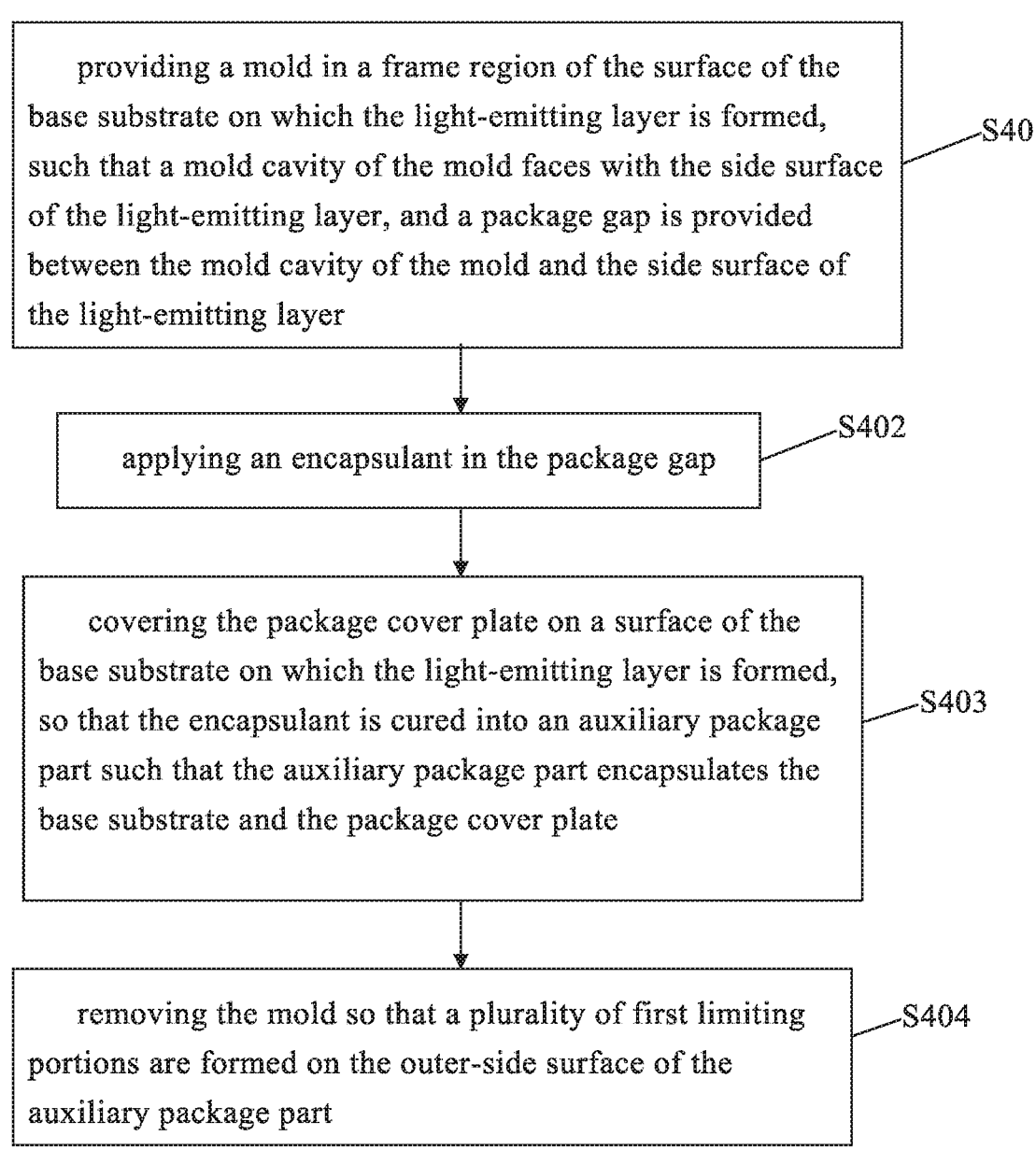
FIG. 6 is a flow chart of encapsulating a base substrate formed with a light-emitting layer and a package cover plate by using an auxiliary package part in an embodiment of the present disclosure.

Specifically, as shown in FIG. 3 and FIG. 6, in the above embodiment, encapsulating the base substrate 1 on which the light-emitting layer 3 is formed and the package cover plate 2 together by using the auxiliary package part 4 includes the following steps:

Step S401: providing a mold in a frame region of the surface of the base substrate 1 on which the light-emitting layer 3 is formed, such that a mold cavity of the mold faces with the side surface of the light-emitting layer 3, and a package gap is provided between the mold cavity of the mold and the side surface of the light-emitting layer 3; wherein the mold cavity of the mold matches the first limiting portion 40.

Step S402: applying an encapsulant in the package gap such that a portion of the encapsulant enters the mold cavity;

Step S403: covering the package cover plate 2 on a surface of the base substrate 1 on which the light-emitting layer 3 is formed, so that the encapsulant is cured into an auxiliary package part 4 such that the auxiliary package part 4 encapsulates the base substrate 1 and the package cover plate 2;

Step S404: removing the mold, so that a plurality of first limiting portions 40 are formed on the outer-side surface of the auxiliary package part 4.

When the base substrate 1 on which the light-emitting layer 3 is formed is packaged with the package cover plate 2 by using the auxiliary package part 4, before applying the encapsulant, the mold is disposed on the frame region of the surface of the base substrate 1 where the light-emitting layer 3 is formed; then, the encapsulant is applied. After the encapsulant is cured, the first limiting portions 40 can be formed.

Figure 7:
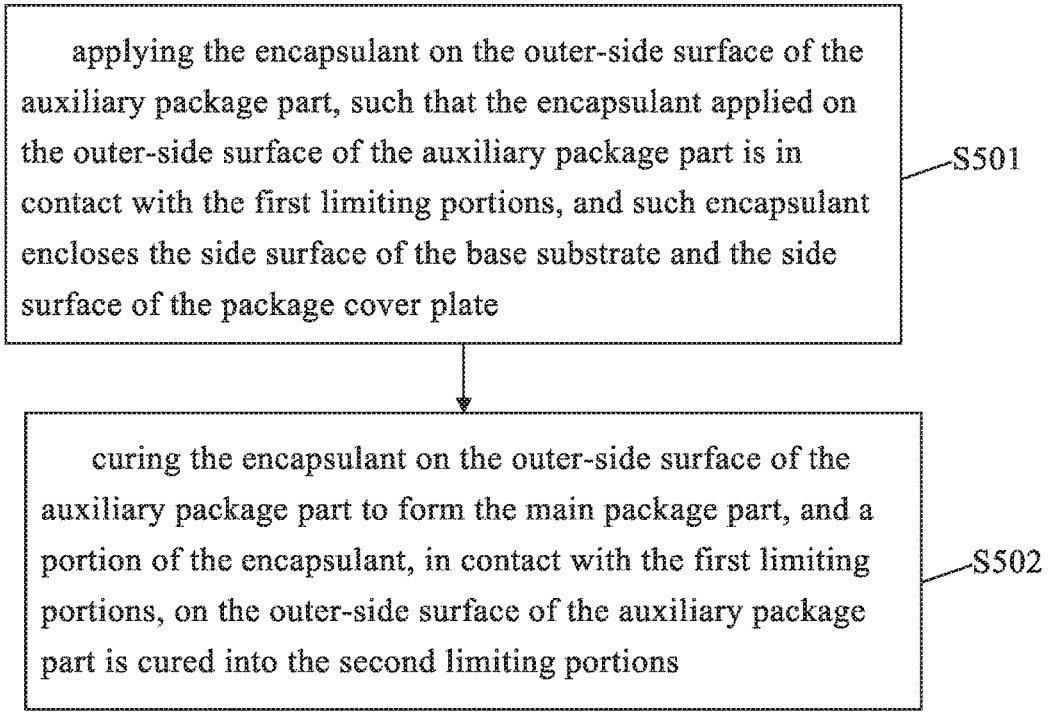
FIG. 7 is a flow chart of encapsulating a base substrate formed with a light-emitting layer and a package cover plate by using a main package part in an embodiment of the present disclosure.

Correspondingly, as shown in FIG. 3 and FIG. 7, in the above embodiment, using the main package part 5 to encapsulate the base substrate 1 on which the light-emitting layer is formed and the package cover plate 2 together includes the following steps:

Step S501: applying the encapsulant on the outer-side surface of the auxiliary package part 4, such that the encapsulant applied on the outer-side surface of the auxiliary package part 4 is in contact with the first limiting portions 40, and such encapsulant encloses the side surface of the base substrate 1 and the side surface of the package cover plate 2;

Step S502: curing the encapsulant on the outer-side surface of the auxiliary package part 4 to form the main package part 5, and a portion of the encapsulant, in contact with the first limiting portions 40, on the outer-side surface of the auxiliary package part 4 is cured into the second limiting portions 520.

In order to further isolate the moisture, in the step S200 in the above embodiment, after forming a light-emitting layer 3 on the surface of the base substrate 1, and before providing a package cover plate 2, the manufacturing method of a display panel further includes the following step:

a moisture absorbing layer 6 is formed on a surface of the light-emitting layer 3 facing away from the base substrate 1, and the moisture absorbing layer 6 is transparent.

Alternatively, the moisture absorbing layer 6 may be provided on the outer-side surface of the auxiliary package part 4 after the process of encapsulating the base substrate 1 on which the light-emitting layer 3 is formed and the package cover plate 2 together by the auxiliary package part 4 in step S400.

Figure 8:
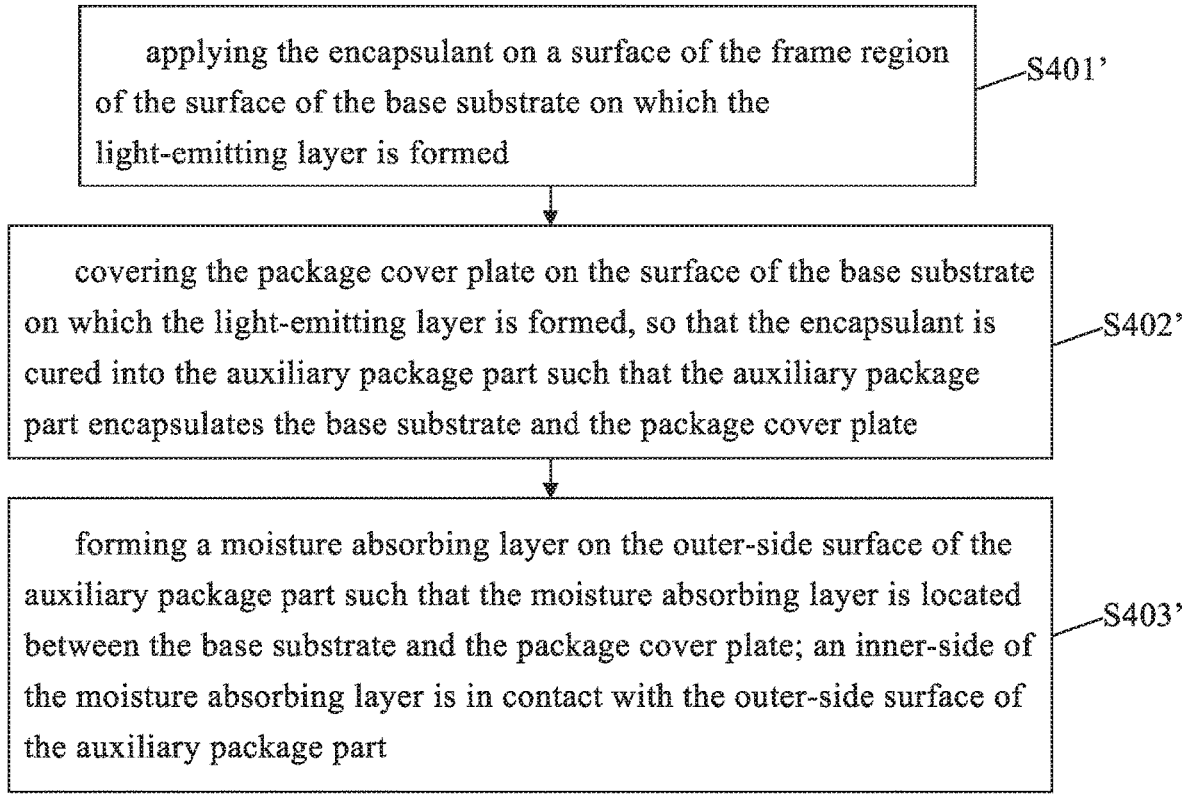
FIG. 8 is a flow chart of encapsulating a base substrate formed with a light-emitting layer and a package cover plate by using an auxiliary package plate in an embodiment of the present disclosure.

In the above case, as shown in FIGS. 4 and 8, using the auxiliary package part 4 to encapsulate the base substrate 1 on which the light-emitting layer 3 is formed and the package cover plate 2 together includes the following steps:

Step S401': applying the encapsulant on a surface of the frame region of the surface of the base substrate 1 on which the light-emitting layer 3 is formed;

Step S402'; covering the package cover plate 2 on the surface of the base substrate 1 on which the light-emitting layer 3 is formed, so that the encapsulant is cured into the auxiliary package part 4 such that the auxiliary package part 4 encapsulates the base substrate 1 and the package cover plate. A distance between the outer-side surface of the auxiliary package part 4 and the side surface of the base substrate 1 is greater than 0.

In the Step 400, after using the auxiliary package part 4 to encapsulate the base substrate 1 on which the light-emitting layer 3 is formed and the package cover plate 2 together, the manufacturing method of a display panel may further include the following steps (as shown in FIG. 8):

Step S403': forming a moisture absorbing layer 6 on the outer-side surface of the auxiliary package part 4 such that the moisture absorbing layer 6 is located between the base substrate 1 and the package cover plate 2. An inner-side of the moisture absorbing layer 6 is in contact with the outer-side surface of the auxiliary package part 4, the distance between the outer-side surface of the moisture absorbing layer 6 and the side surface of the base substrate 1 is greater than 0. Among them, the moisture absorbing layer 6 can transmit light or block light.

Figure 9:
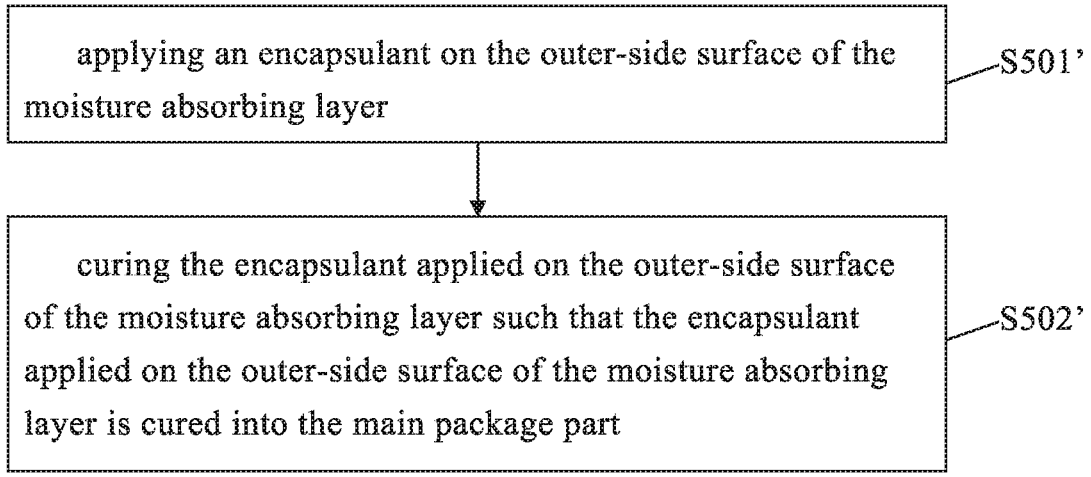
FIG. 9 is a flow chart of encapsulating a base substrate formed with a light-emitting layer and a package cover plate with a main package part in an embodiment of the present disclosure.
Figure 10:
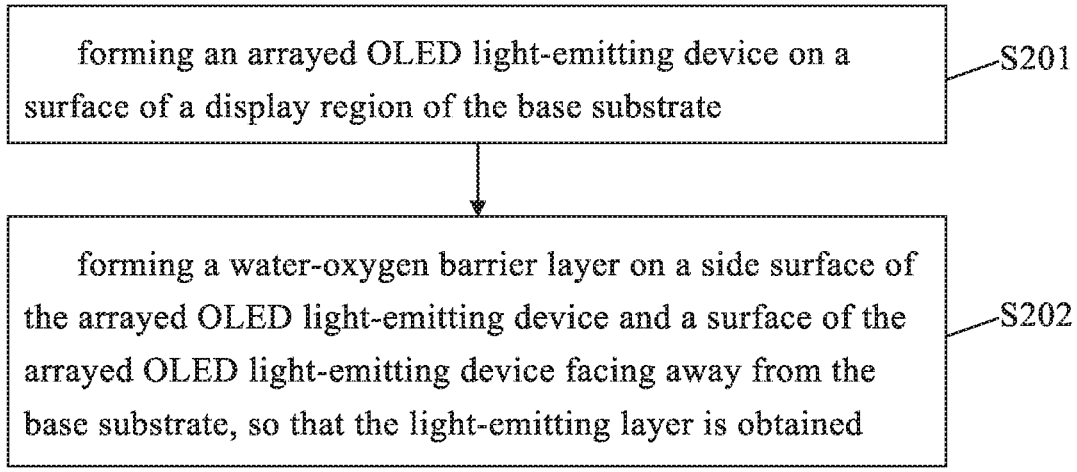
FIG. 10 is a flow chart of forming a light-emitting layer on a surface of a base substrate in an embodiment of the present disclosure.

In the above embodiment, using the main package part 5 to encapsulate the base substrate 1 on which the light-emitting layer 3 is formed and the package cover plate 2 together includes the following steps (as shown in FIG. 9):

Step S501': applying an encapsulant on the outer-side surface of the moisture absorbing layer 6, Step S502': curing the encapsulant applied on the outer-side surface of the moisture absorbing layer 6 such that the encapsulant applied on the outer-side surface of the moisture absorbing layer 6 is cured into the main package part 5.

An embodiment of the present disclosure further provides a display device, which includes the display panel provided by the above technical solutions.

The beneficial effects of the display device provided by the embodiment of the present disclosure are the same as those of the display panel provided by the above technical solutions, and are not described herein.

The display device provided by the above embodiment may be any product or component having a display function, such as a mobile phone, a tablet PC, a television, a display, a laptop, a digital photo frame, or a navigator.

In the description of the above embodiments, specific features, structures, materials or characteristics may be combined in any one or more embodiments or examples in any suitable manner.

The above description is only the specific embodiment of the present disclosure, but the scope of the present disclosure is not limited thereto, and any person skilled in the art can easily conceive modifications or substitutions within the technical scope of the present disclosure, which should be within the protection scope of the present disclosure. Therefore, the protection scope of the present disclosure should be determined by the scope of the claims.

What is claimed is:

1. A manufacturing method of a display panel, comprising:
   providing a base substrate;
   forming a light-emitting layer on a surface of the base substrate;
   providing a package cover plate disposed to be parallel to the base substrate;
   using a main package part to encapsulate a side surface of a circumferential edge of the base substrate on which the light-emitting layer is formed and a side surface of a circumferential edge of the package cover plate together, such that the light-emitting layer is located between the base substrate and the package cover plate, wherein the main package part is formed by a non-conductive encapsulant, and the main package part is configured not to contact with the light-emitting layer, wherein the main package part comprises a first package portion and a second package portion;
   the second package portion is located between the base substrate and the package cover plate, an upper surface of the second package portion is in contact with the package cover plate, and a lower surface of the second package portion is in contact with the base substrate, and
   the first package portion is respectively engaged with the side surface of the base substrate, the side surface of the package cover plate, and an outer-side surface of the second package portion;
   wherein before using the main package part to encapsulate the base substrate on which the light-emitting layer is formed and the package cover plate together, and after providing the package cover plate, the manufacturing method of a display panel further comprises the following step:
   encapsulating the base substrate on which the light-emitting layer is formed and the package cover plate together by an auxiliary package part, such that an upper surface of the auxiliary package part is in contact with the package cover plate and a lower surface of the auxiliary package part is in contact with the base substrate, and an outer-side surface of the auxiliary package part faces with an inner-side surface of the second package portion, and an inner-side surface of the auxiliary package part faces with a side surface of the light-emitting layer;
   wherein encapsulating the base substrate on which the light-emitting layer is formed and the package cover plate together by using the auxiliary package part comprises the following steps:
   providing a mold in a frame region of the surface of the base substrate on which the light-emitting layer is formed such that a mold cavity of the mold faces with the side surface of the light-emitting layer, and a package gap is provided between the mold cavity of the mold and the side surface of the light-emitting layer;
   applying an encapsulant in the package gap such that a portion of the encapsulant enters the mold cavity;
   covering the package cover plate on a surface of the base substrate on which the light-emitting layer is formed, so that the encapsulant is cured into an auxiliary package part such that the auxiliary package part encapsulates the base substrate and the package cover plate;
   removing the mold, so that a plurality of first limiting portions are formed on the outer-side surface of the auxiliary package part;
   using the main package part to encapsulate the base substrate on which the light-emitting layer is formed and the package cover plate together comprises the following steps:
   applying the encapsulant on the outer-side surface of the auxiliary package part such that the encapsulant applied on the outer-side surface of the auxiliary package part is in contact with the first limiting portions, and such encapsulant encloses the side surface of the base substrate and the side surface of the package cover plate;
   curing the encapsulant on the outer-side surface of the auxiliary package part to form the main package part, and a portion of the encapsulant, which is in contact with the first limiting portions, on the outer-side surface of the auxiliary package part is cured into the second limiting portions.

2. The manufacturing method of a display panel according to claim 1, wherein after forming a light-emitting layer on the surface of the base substrate, and before providing a package cover plate, the manufacturing method of a display panel further comprises the following step:
   a moisture absorbing layer is formed on a surface of the light-emitting layer facing away from the base substrate, and the moisture absorbing layer is transparent.

3. The manufacturing method of a display panel according to claim 1, wherein using the auxiliary package part to encapsulate the base substrate on which the light-emitting layer is formed and the package cover plate together comprises the following steps:
   applying the encapsulant on a surface of the frame region of the surface of the base substrate on which the light-emitting layer is formed;

covering the package cover plate on the surface of the base substrate on which the light-emitting layer is formed, so that the encapsulant is cured into the auxiliary package part such that the auxiliary package part encapsulates the base substrate and the package cover plate, and a distance between the outer-side surface of the auxiliary package part and the side surface of the base substrate is greater than 0;

after using the auxiliary package part to encapsulate the base substrate on which the light-emitting layer is formed and the package cover plate together, and before using the main package part to encapsulate the base substrate on which the light-emitting layer is formed and the package cover plate together, the manufacturing method of a display panel further comprises the following steps:

forming a moisture absorbing layer on the outer-side surface of the auxiliary package part such that the moisture absorbing layer is located between the base substrate and the package cover plate, an inner-side of the moisture absorbing layer is in contact with the outer-side surface of the auxiliary package part, the distance between the outer-side surface of the moisture absorbing layer and the side surface of the base substrate is greater than 0;

using the main package part to encapsulate the base substrate on which the light-emitting layer is formed and the package cover plate together comprises the following steps:

applying an encapsulant on the outer-side surface of the moisture absorbing layer, curing the encapsulant applied on the outer-side surface of the moisture absorbing layer such that the encapsulant applied on the outer-side surface of the moisture absorbing layer is cured into the main package part.

4. The manufacturing method of a display panel according to claim 1, wherein forming the light-emitting layer on the surface of the base substrate comprises the following steps:

forming an arrayed OLED light-emitting device on a surface of a display region of the base substrate; and forming a water-oxygen barrier layer on a side surface of the arrayed OLED light-emitting device and a surface of the arrayed OLED light-emitting device facing away from the base substrate, so that the light-emitting layer is obtained;

wherein the outer-side surface of the water-oxygen barrier layer faces with the inner-side surface of the second package portion, and a surface of the water-oxygen barrier layer facing away from the arrayed OLED light-emitting device faces with the package cover plate.

* * * * *